(12) United States Patent
Traynor

(10) Patent No.: US 6,778,320 B1
(45) Date of Patent: Aug. 17, 2004

(54) COMPOSITE OPTICAL AMPLIFIER

(75) Inventor: Nicholas J. Traynor, Fontainebleau (FR)

(73) Assignee: Avanex Corporation, Fremont, CA (US)

( * ) Notice: Subject to any disclaimer, the term of this patent is extended or adjusted under 35 U.S.C. 154(b) by 775 days.

(21) Appl. No.: 09/718,036

(22) Filed: Nov. 20, 2000

(51) Int. Cl.$^7$ ................................................ H01S 3/00
(52) U.S. Cl. ...................... 359/334; 359/344; 359/337.4
(58) Field of Search ................................ 359/334, 344, 359/337.4

(56) References Cited

U.S. PATENT DOCUMENTS

| | | | |
|---|---|---|---|
| 4,747,650 A | | 5/1988 | Sakuda |
| 4,939,474 A | | 7/1990 | Eisenstein et al. |
| 5,579,155 A | | 11/1996 | Kitamura |
| 5,673,141 A | * | 9/1997 | Gambini ................ 359/341.1 |
| 5,673,280 A | | 9/1997 | Grubb et al. |
| 6,490,077 B1 | * | 12/2002 | Conradi ..................... 359/334 |

FOREIGN PATENT DOCUMENTS

EP  1030 470 A2  8/2000  .......... H04B/10/17

OTHER PUBLICATIONS

Patent Abstracts of Japan, vol. 1997, No. 03, Mar. 31, 1997, JP 08 313944 A.

Dianov et al. "1.3µm Raman Fiber Amplifier Pumped by Chromium–Doped Forsterite Laser" 22$^{nd}$ European Conference on Optical Communication ECOC '96, p. 289–292.

S.A.E. Lewis et al. "Broadband high–gain dispersion compensating Raman amplifier", Electronics Letters, 3$^{rd}$ Aug. 2000, vol. 36, No. 16.

* cited by examiner

Primary Examiner—Mark Hellner
(74) Attorney, Agent, or Firm—Moser, Patterson & Sheridan, L.L.P.

(57) ABSTRACT

An optical signal amplifier includes a Raman fiber amplifier and a semiconductor optical amplifier. The Raman fiber amplifier utilizes a portion of the pump radiation to amplify the optical signal resulting in an amplified optical signal and a residual pump radiation. The semiconductor optical amplifier receives the amplified signal and the residual pump radiation and utilizes the residual pump radiation to increase a saturation output power of the semiconductor optical amplifier while amplifying the amplified signal resulting in a twice amplified signal.

34 Claims, 3 Drawing Sheets

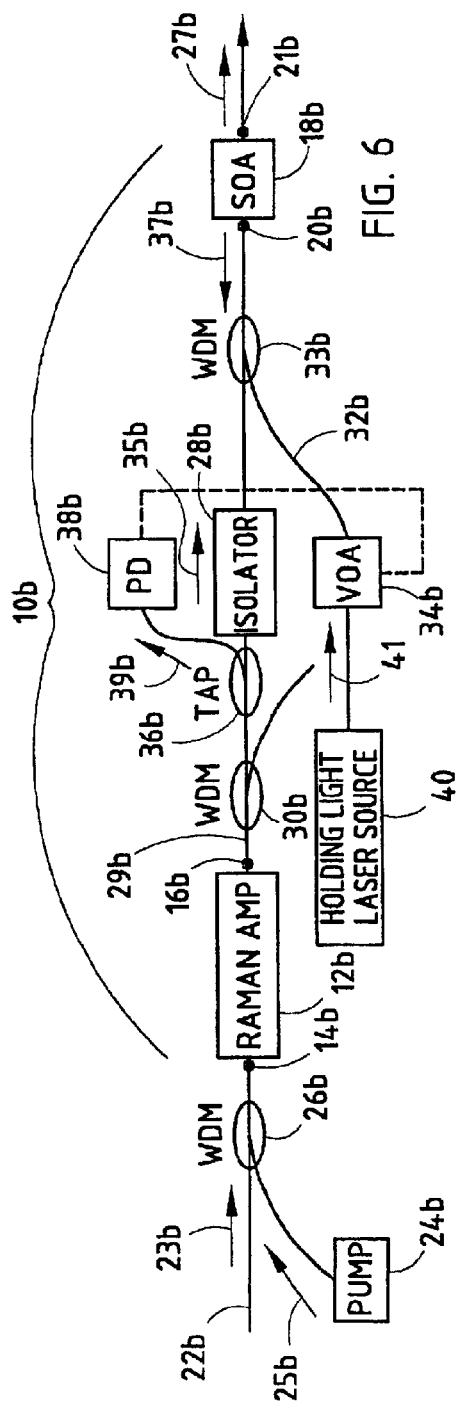
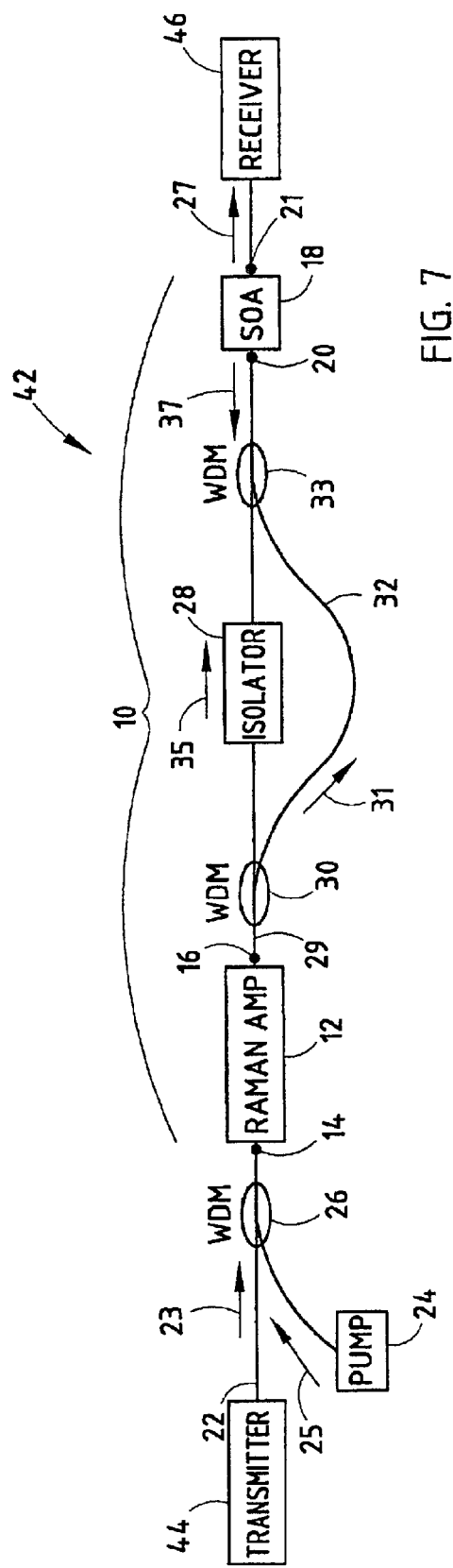
FIG. 6
FIG. 7

COMPOSITE OPTICAL AMPLIFIER

BACKGROUND OF THE INVENTION

1. Field of the Invention

The invention is directed to a composite optical amplifier, and in particular, to a composite optical amplifier that includes a Raman fiber amplifier and semiconductor optical amplifier.

2. Technical Background

The continuous growth of bandwidth requirements in optical-based communication systems has resulted in a large demand for systems able to operate outside the amplification band provided by Erbium-doped fiber amplifiers. Erbium-doped fiber amplifiers effectively operate over a limited wavelength band. Depending on amplifier configuration and fiber composition, Erbium-doped fiber can be used for amplification in a wavelength band extending from 1530 nm to 1620 nm, although at least two different erbium-doped fiber amplification configurations would be required to cover this entire range.

Other rare earth-doped fiber amplifiers have been used for amplification outside the erbium wavelength band from 1530 nm to 1620 nm. These other rare earth-doped amplifiers include Thulium-doped amplifiers operating from 1440 nm to 1510 nm, Praseodymium amplifiers operating from 1250 nm to 1310 nm and Neodymium amplifiers operating from 1310 nm to 1350 nm. Each of these rare earth-doped amplifiers exhibit very low efficiency as well as other technical problems associated with each particular kind of dopant when compared to Erbium-doped amplifiers.

Rare earth-doped amplification systems cover much of the available transmission window of traditional silica fiber. However, this transmission window has been expanded with the development of new fibers. In many new fibers, where the OH absorption around 1400 nm has been greatly reduced, there is a potential for optical amplifier configurations which can amplify between an entire optical operating range of from 1100 nm to 1700 nm.

Two amplifier configurations have been used to amplify wavelength band ranges greater than can be amplified with singular rare earth-doped amplifiers. The first of these is the Raman fiber amplifier which converts laser radiation from a pump laser into another wavelength range stimulated Raman scattering. More specifically, Raman scattering operates on the principle of Stokes light generation, which is downshifted from the optical pump frequency by an energy determined by vibrational oscillation modes in the atomic structure of the fiber. In other words, Raman gain results from the interaction of intense light with optical phonons in the glass, and the Raman effect leads to a transfer of power from one optical beam, or the pump, to another optical beam, or the signal. During a Raman gain, the signal is downshifted in frequency and upshifted in wavelength by an amount determined by the vibrational modes of the glass or the medium.

In operation a pump laser is used to conduct pump radiation through a Raman medium. Signal radation which propagates co-linearly with the pump will be amplified by stimulated Raman scattering, wherby a pump photon is stimulated to emit an optical phonon and also a photon at the same energy and phase as the signal photon. The wavelength range over which amplification occurs is referenced to the wavelength of the optical pump and the bandwidth is determined by the phonon spectra of the Raman medium. A direct consequence of this is that amplification can be realized at any wavelength in an optical fiber by correct choice of the wavelength of the optical pump.

The gain of the Raman amplifier is determined by the Raman gain coefficient, the pump power, the fiber length and the effective area of the optical mode in the fiber. For high gain, a high gain coefficient, a high pump power and a long fiber length along with a small effective area are required. The Raman gain coefficient for silica fibers is shown in FIG. 1. Notably, the gain extends over a large frequency range of up to 40 THz with a broad peak centered at 13.2 THz. This broad behavior is due to the amorphous structure of the silica glass and means that the Raman effect can be used to effect broad band amplification. The Raman gain depends on the composition of the fiber core and can be varied with different dopant types and concentrations within the fiber.

One of the problems generally associated with Raman amplifiers is the requirement of a relatively large pumping power. Raman amplifiers require a significantly higher optical pump power to achieve the same gain associated with Erbium-doped fiber amplifiers. In addition, a significant proportion of the optical pump power can be wasted and unused at the fiber output as a result of the inefficiency of the Raman gain. A significant advantage, however, of Raman amplifiers is the low noise figure associated therewith. More specifically, noise figures close to the quantum limit of 3 dB are possible with Raman amplifiers.

It is known to use Raman fiber amplifiers in conjunction with Erbium-doped fiber amplifiers in transmission systems. However, while the utilization of distributed Raman amplification in conjunction with Erbium-doped fiber amplifiers alleviates the need for high Raman gain, the utility of such configurations are limited to the effective Erbium window, or to other rare earth windows.

A semiconductor optical amplifier is a second kind of amplifier that can also provide gain over the entire operating transmission window of 1100 nm to 1650 nm. For example, semiconductor optical amplifier components based on the material composite of $Ga_x In_{1-x} As_y P_{1-y}$ can provide gain within the range of 1000 nm to 1650 nm depending on the relative concentration of the constituent elements.

Optical amplification, including amplification affected by a semiconductor optical amplifier, relies on the known physical mechanisms of population inversion and stimulated emission. More specifically, amplification of an optical signal depends on the stimulated transition of an optical medium from an inverted, excited state to a lower, less excited state. Prior to the actual amplification of the optical signal, a population inversion occurs, i.e., more upper excited states exist than lower states. This population inversion is effected by appropriately energizing the system. In semiconductor optical amplifiers, an excited state is a state in which there exists an electron in the conduction band and a concomitant hole in the valence band. A transition from such an excited state, to a lower state in which neither an electron nor a hole exist, results in the creation of a photon or a stimulated emission. The population inversion is depleted every time an optical signal passes through the amplifier and is amplified. The population inversion is then reestablished over some finite period of time. As a result, the gain of the amplifier will be reduced for some given period of time following the passage of any optical signal through the amplifier. This recovery time period is typically denoted as the "gain-recovery time" of the amplifier.

In contrast to Erbium-doped amplifiers, or other rare earth-doped amplifiers, semiconductor optical amplifiers are smaller, consume less power and can be formed in an array more easily. Accordingly, semiconductor optical amplifiers are important in applications such as loss compensation for optical switches used in multi-channel optical transmission systems or optical switchboard systems. In contrast to Raman fiber amplifiers, semiconductor optical amplifiers are electrically pumped and as such, provide very efficient gain.

Two major drawbacks are associated with semiconductor optical amplifiers. The first drawback is that the noise figure associated with semiconductor optical amplifiers is significantly high. While all amplifiers degrade the signal-to-noise ratio of the amplified signal because of amplified spontaneous emission that is added to the signal during amplification, the noise figure associated with semiconductor optical amplifiers is extremely problematic. More specifically, the best achievable intrinsic noise figure for semiconductor optical amplifiers is around 4 dB for devices based on multiple quantum well structures, and around 5 dB for devices based on bulk guiding structures. Further, since the optical mock field diameter is very small in semiconductor optical amplifiers with respect to optical fibers, the coupling loss between the two is poor (generally 2–3 dB). As a result, the best achievable noise figures associated with semiconductor optical amplifiers are typically somewhere between 6 to 8 dB, depending on the device structure and the coupling configuration. A second problem associated with semiconductor optical amplifiers is signal cross-talk resulting from cross-gain modulation. Signal cross-talk arises because the saturation output power of the semiconductor optical amplifier is lower than that of fiber based amplifiers, and because the gain recovery time is on the same time scale as the data repetition rate. Thus, a semiconductor optical amplifier amplifying multiple signals with a combined input power greater than the input saturation power will superimpose cross-talk caused by gain modulation between the relative channels.

SUMMARY OF THE INVENTION

The invention relates to an optical signal amplifier that includes a Raman fiber amplifier with a semiconductor optical amplifier. More specifically, the present inventive optical amplifier makes use of the low noise figure typically associated with Raman amplifiers, the significant gain typically associated with semiconductor optical amplifiers and the residual pump power from a Raman amplifier to increase the saturation output power of semiconductor optical amplifier.

In a preferred embodiment, an optical signal amplifier includes a Raman fiber amplifier having an input for receiving an optical signal and a pump radiation, and an output, wherein the pump radiation amplifies the optical signal resulting in an amplified optical signal and a residual pump radiation. The optical signal amplifier also includes a semiconductor optical amplifier having an input coupled to the output of the Raman amplifier for receiving the amplified optical signal and the residual pump radiation, wherein the semiconductor optical amplifier amplifies the input signal resulting in a twice amplified signal, and wherein the residual pump radiation increases a saturation output power of the semiconductor optical amplifier, thereby reducing signal cross-talk in the twice amplified signal.

In addition, two disclosed embodiments of the optical signal amplifier include an optical isolator for preventing a backward propagating amplified spontaneous emission generated within the semiconductor optical amplifier from reaching the Raman fiber amplifier, and a variable optical attenuator for attenuating the residual pump radiation prior to the residual pump radiation reaching the semiconductor optical amplifier.

Other embodiments include an optical communications systems that utilizes the optical signal amplifier, as well as a method for utilization of the composite optical signal amplifier.

One of the advantages of the optical amplifier of the present invention is that it offers the benefit of a relatively large gain in optical signal strength together with a substantially low noise figure and a minimization of signal cross-talk resulting from cross-gain modulation.

BRIEF DESCRIPTION OF THE DRAWINGS

FIG. 6 is a schematic view of a second alternative embodiment of the optical amplifier, which includes a holding light laser source; and FIG. 7 is a schematic view of a fiber optic communication system employing a composite optical amplifier of the present invention.

DETAILED DESCRIPTION OF THE PREFERRED EMBODIMENT

Figure 2:
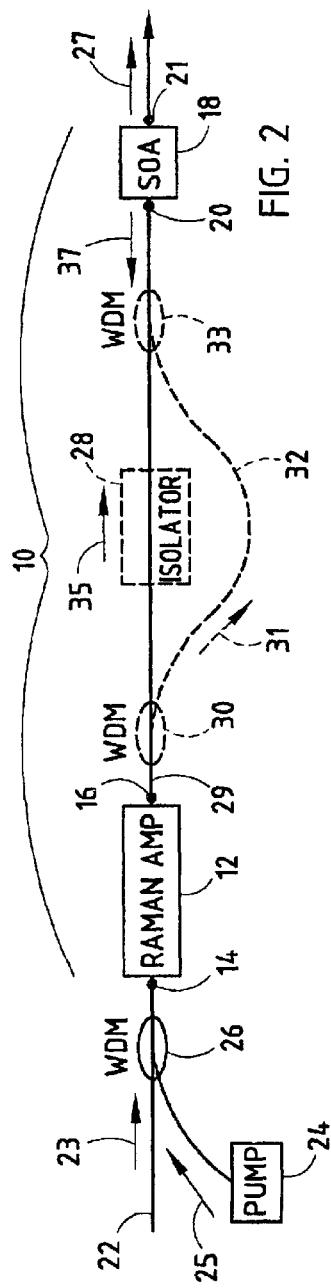
FIG. 2 is a schematic view of a composite optical amplifier embodying the present invention, including a Rarman fiber amplifier and a semiconductor optical amplifier.

Additional features and advantages of the invention will be set forth in the detailed description which follows and will be apparent to those skilled in the art from the description or recognized by practicing the invention as described in the description which follows together with the claims and appended drawings.

It is to be understood that the foregoing description is exemplary of the invention only and is intended to provide an overview for the understanding of the nature and character of the invention as it is defined by the claims. The accompanying drawings are included to provide a further understanding of the invention and are incorporated and constitute part of this specification. The drawings illustrate various features and embodiments of the invention which, together with their description, serve to explain the principals and operation of the invention.

Definitions

The following definitions are commonly used in the art.

The single-pass gain of Raman fiber amplifiers is generally defined as, $$G_a = \frac{I_s(L)}{I_s(O)} = \exp\left(\frac{g_r P_o}{A_{\mathit{eff}}} - \frac{(I - \exp(-\alpha_s L))}{\alpha_P}\right)\exp(-\alpha_s L);$$

wherein $I_s(0)\exp(-\alpha_s L)$ is the signal intensity in the absence of the pump, $I_s(L)$ is the signal intensity along the length of the Raman fiber amplifier, $g_r$ is the material dependent gain coefficient, P is the pump power, L is the length of the Raman optical fiber, $\alpha_p$ is pump attenuation, $\alpha_s$ is signal attenuation and $A_{eff}$ is the effective area of the optical mode in the fiber.

The effective area is generally defined as, $$A_{eff} = 2\pi (\int E^2\, r\, dr)^2 / (\int E^4 r\, dr),$$

wherein the integration limits are 0 to $\infty$, and E is the electric field associated with the propagated light.

The noise figure (linear units) with a Raman optical amplifier and a semiconductor optical amplifier is generally defined as, $$F = 2n_{sp}/C,$$

wherein $n_{sp}$ is the spontaneous emission factor and C is the input coupling efficiency to the amplifier.

The noise figure associated with a Raman optical amplifier and a semiconductor optical amplifier is generally defined as, $$NF(dB) = 10 * \log_{10}(2n_{sp}/C),$$

wherein $n_{sp}$ is the spontaneous emission factor and C is the input coupling efficiency to the amplifier.

The mechanism for improving the saturation output power of the semiconductor optical amplifier is defined as, $$\frac{dI^{(s)}}{dz} = \tau A^{(s)} \frac{\tau J/ed + (\tau A^{(p)}/h\nu)N_a^{(p)}I^{(p)} - N_a^{(s)}}{1 + I^{(s)}/I_o^{(s)}} I^{(s)},$$

where $$\frac{1}{\tau} = \frac{1}{\tau_c} + \frac{A^{(p)}I^{(p)}}{h\nu},\quad I_o^{(s)} = \frac{h\nu}{\tau A^{(s)}} = \frac{h\nu}{A^{(s)}}\left(\frac{1}{\tau_c} + \frac{A^{(p)}I^{(p)}}{h\nu}\right),$$

and where $I^{(i)}$ is the pumping light intensity, $\tau$ is the confinement factor, $A^{(i)}$ is the differential gain coefficient, N is the carrier density, $N_a^{(i)}$ is the carrier density in a transparent condition, h$\nu$ is the photon energy, $\tau$ is the overall carrier recombination including stimulated recombination, $\tau_c$ is the carrier lifetime, J is the injection current, e is the electronic change, d is the waveguide thickness, and superscripts p and s denote pump and signal lights, respectively.

$I^{(s)}/I_o^{(s)}$ indicates the degree of gain saturation and is inversely proportional to $I_o^{(s)}$, which is larger with pumping light than without pumping light. Injecting a pumping light in the semiconductor optical amplifier makes $I_o^{(s)}$ larger, which results in an improved saturation characteristic of the semiconductor optical amplifier.

Controlling the carrier density effects the unsaturated gain of the semiconductor optical amplifier by, $$(\tau A^{(p)}/h\nu)N_a^{(p)}I^{(p)} = \frac{\tau N_a^{(p)} A^{(p)} I^{(p)}}{h\nu + \tau_c A^{(p)} I^{(p)}},$$

where choosing the proper pumping light wavelength can be used to control the unsaturated gain.

The noise figure of a two stage amplifier is defined as, $$F_{tot} = F_1 + \frac{F_2 - 1}{G_1},$$

wherein $F_{tot}$ is the noise figure of the composite amplifier, $F_1$ and F2 are the individual noise figures of the first and second stage amplifiers, respectively, and $G_1$ is the gain of the first stage.

The reference numeral 10 (FIG. 2) generally designates a composite optical amplifier embodying the present invention. The composite optical amplifier 10 includes a Raman optical fiber amplifier 12, having an input 14 for receiving an optical signal and pump radiation, and an output 16. A portion of the pump radiation amplifies the optical signal within Raman optical amplifier 12 resulting in an amplified optical signal and a residual pump radiation. The composite optical amplifier 10 also includes a semiconductor optical amplifier 18 having an input 20 for receiving the amplified optical signal and the residual pump radiation. The semiconductor optical amplifier 18 amplifies the amplified signal resulting in a twice amplified signal while the residual pump radiation increases a saturation power output of the semiconductor optical amplifier 18, thereby reducing signal cross-talk in the twice-amplified signal.

In the illustrated example, a waveguide optical fiber 22 guides the optical signal traveling in a direction 23 to input 14 of Raman optical amplifier 12. Although in this embodiment, the pump 24 generates light that copropagates with the signal, a counter propagating pump can also be utilized. This configuration would minimize pump noise transferred to the signal. An optical laser pump 24 generates a pump radiation in a direction 25 which is coupled to the optical fiber 22 via a wave division multiplexer 26. As illustrated, pump 24 includes a semiconductor diode laser. However, a Raman laser or other laser emitting device may be substituted. Preferably, no more than two semiconductor optical pumps are used. Also, although in the illustrated example several wave division multiplexers are used for coupling and decoupling of signals from and to the composite optical amplifier 10, any coupler capable of dividing and combining optical signals of varying wavelengths may be used.

The first stage of the composite optical amplifier is the Raman optical amplifier 12. Only a modest gain is required from Raman optical amplifier 12 because the amplified signal is later re-amplified by semiconductor optical amplifier 18. The relatively low gain required from the Raman optical amplifier 12 relaxes the constraints and requirements of a high pump power that would be required to obtain a high gain from the Raman amplifier 12. In the present example, a gain from Raman optical amplifier 12 within the range of about 15 dB to about 20 dB would be sufficient, however, a gain of 15 dB is preferred.

Only a portion of the pump power or radiation delivered to Raman optical amplifier 12 is used to amplify the optical signal within the Raman optical amplifier 12, with the remainder of the pump radiation exiting the Raman optical amplifier 12 as a residual pump power radiation. It is estimated that 20–30% of the original pump radiation exits the Raman optical amplifier as the residual pump power, however, other percentages and amounts may be obtainable depending upon the optical characteristics of Raman optical amplifier 12 and the amount of pump radiation supplied to Raman optical amplifier 12 to amplify the optical signal therein.

The residual pump power that exits Raman optical amplifier 12 is then conducted to semiconductor optical amplifier 18 via fiber 29 in a direction indicated by arrow 35. The injection of the residual pump power, or holding light, into semiconductor optical amplifier 12 at a wavelength on the edge of the gain spectrum enhances the output saturation power of semiconductor optical amplifier 12. This "holding light" reduces the carrier lifetime within semiconductor optical amplifier 18 and thus increases the saturation output power thereof, which is inversely proportional to the carrier lifetime. In other words, the holding light maintains the separation of the quasi-Fermi levels and enhances the gain recovery rate or gain-recovery time of the amplifier, which is the result of a decrease in the effective carrier lifetime. The amplified signal is amplified within semiconductor optical amplifier 18 resulting in a twice amplified signal which leaves semiconductor optical amplifier 18 at output 21 in a direction 27.

Figure 3:
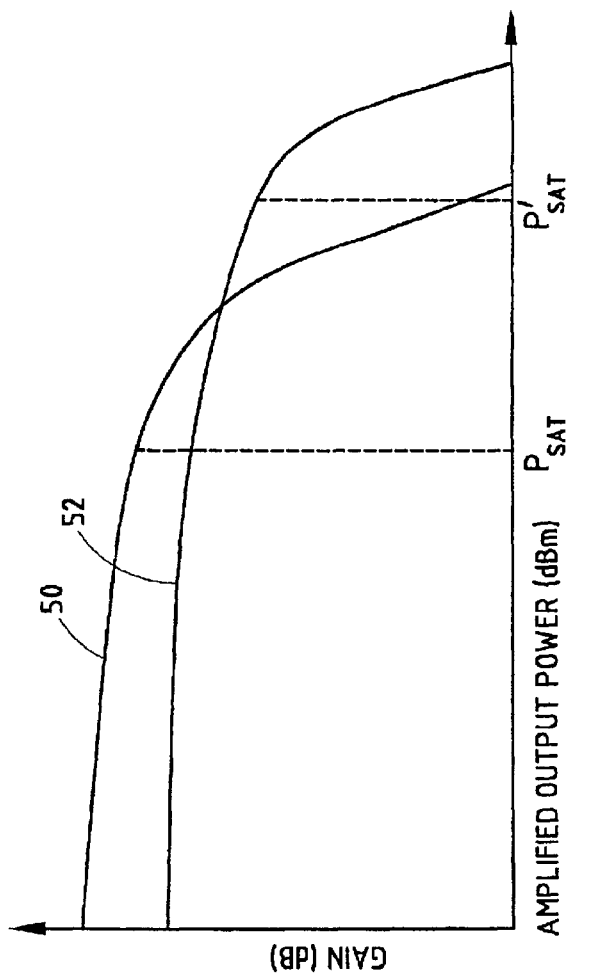
FIG. 3 is a diagram of gain versus amplified output power of the semiconductor optical amplifier of FIG. 2.

The increase of the saturation output power of semiconductor optical amplifier 18 is similar to that of gain clamping and results in a gain curve as shown in FIG. 3. As illustrated, a small signal gain is reduced from the gain without holding light injection, illustrated as line 50, but is clamped to a fairly consistent value, illustrated as line 52, until the amplified signal power becomes similar in magnitude to the holding light power, resulting in a shift of the power saturation point. As illustrated, the power saturation point is the position along the gain curve that the gain is reduced with respect to 3 dB with the small signal gain value. It has been shown that the presence of 34 mw of holding light can increase the output saturation power of a semiconductor optical amplifier by up to 5.6 dB. This is shown in FIG. 3 as the difference between the saturation output power without the presence of a holding light, $P_{sat}$ 50, and the saturation output power with the presence of the holding light, $P_{sat}$ 52. The pumping light injection wavelength must lie on the edge of the semiconductor optical amplifier gain spectrum in order to keep the gain compression at a minimum and the optical parameters of Raman optical amplifier 12 and of semiconductor optical amplifier 18 are chosen such that the Stokes shift that occurs to the pump radiation as it travels through Raman optical amplifier 12 and which is embodied in the resulting residual pump radiation matches the required wavelength shift from the gain peak in semiconductor optical amplifier 18.

Another advantage of the composite optical amplifier 10 is that it provides a noise figure which is dictated by the low noise figure of the Raman optical amplifier 12. This is because the noise generated by an amplifier is a function of the ratio of the amount of amplification provided by the amplifier to the non-coherent spontaneous emission generated by the amplifier. In a two stage amplifier the spontaneous emission generated by the second stage is very small with respect to the amplified spontaneous emission incident from the first stage, and adds little to the overall noise figure. As a result, in a two stage amplifier, when the noise figure of the first stage is low the total noise figure is low, even if the second stage amplifier has a noise figure considerably greater than the first stage. In the present example, a noise figure from Raman optical amplifier 12 of between about 3 dB and about 5 dB is obtainable, although a noise figure of no greater than about 4 dB is more easily obtainable. Further, a noise figure from semiconductor optical amplifier 18 of between about 7dB and about 10 dB is obtainable, although a noise figure of no greater than about 8 dB is more easily obtainable. Therefore, composite optical amplifier 10 provides a preferred noise figure of no greater than 4.3 dB.

The composite optical amplifier 10 may also include an optical isolator 28 (shown in phantom line) in optical communication with output 16 of Raman optical amplifier 12 and input 20 of semiconductor optical amplifier 18. A wave division multiplexer 30 (shown in phantom line) is utilized as a decoupler for decoupling the residual pump radiation from the amplified signal after the residual pump radiation and amplified signal have been delivered through Raman optical amplifier 12. The residual pump radiation travels via a fiber 32 (shown in phantom line) in a direction 31 to a second wave division multiplexer 33 (shown in a phantom line) which is in optical communication with fiber 32. The second wave division multiplexer 33 recouples the residual pump radiation with the amplified signal prior to the residual pump radiation and the amplified signal entering the semiconductor optical amplifier 18. The optical isolator 28 is configured to allow passage of the amplified signal therethrough in a direction 35 while preventing a backward propagating amplified spontaneous emission generated within the semiconductor optical amplifier and traveling in a direction 37 from reaching the Raman optical amplifier 12. An optical isolator 28 may be unnecessary in certain systems where the effects on Raman optical amplifier 12 from the backward propagating amplified spontaneous emission generated within semiconductor optical amplifier 18 may be minimal. In such case, the output 16 of Raman amplifier 12 is coupled directly to input 20 of amplifier 18.

Figure 1:
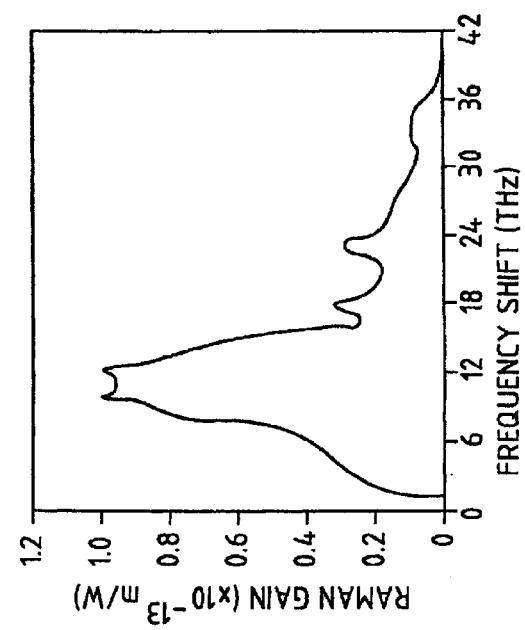
FIG. 1 is a diagram of the Raman gain coefficient for silica fibers.
Figure 4:
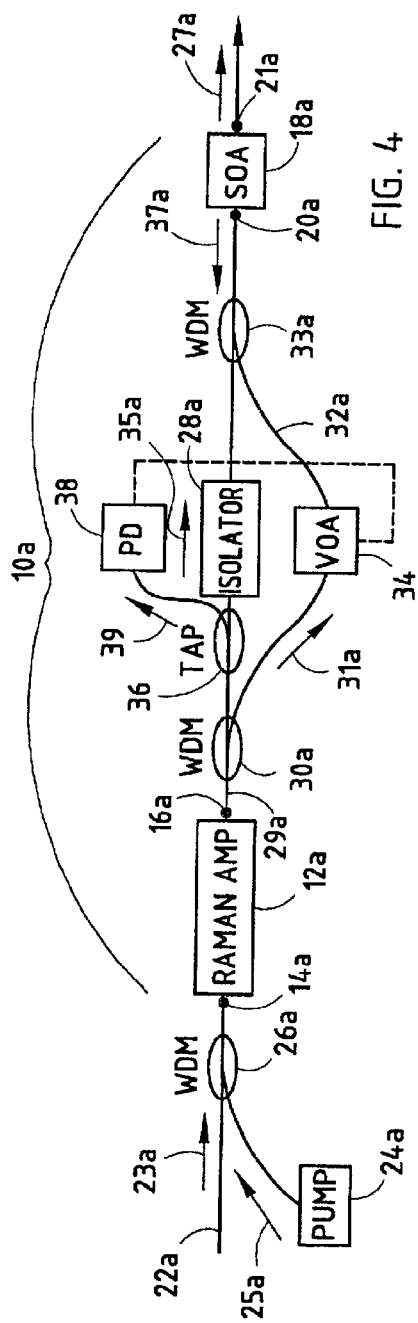
FIG. 4 is a schematic view of an alternative embodiment of the composite optical amplifier, which includes a variable optical amplifier and a photo diode.

Another embodiment of the present composite amplifier 10a is shown in FIG. 4. Since composite optical amplifier 10a is similar to previously described composite optical amplifier 10, similar parts appearing in FIGS. 1 and 4, respectively, are represented by the same, corresponding reference numeral, except for the suffix "a." In composite optical amplifier 10a, a variable optical attenuator 34 is used to attenuate the residual pump radiation exiting Raman optical amplifier 12a, thereby adjusting the saturation output power of semiconductor optical amplifier 18a. More specifically, an optical tap 36 is used to direct a portion of the amplified signal to a photo diode 38 in a direction 39. Photo diode 38 measures the signal power of the amplified signal, and provides a control signal to the variable optical attenuator 34. Variable optical attenuator 34 responds to control the amount of residual pump radiation that reaches semiconductor optical amplifier 18a.

Figure 5:
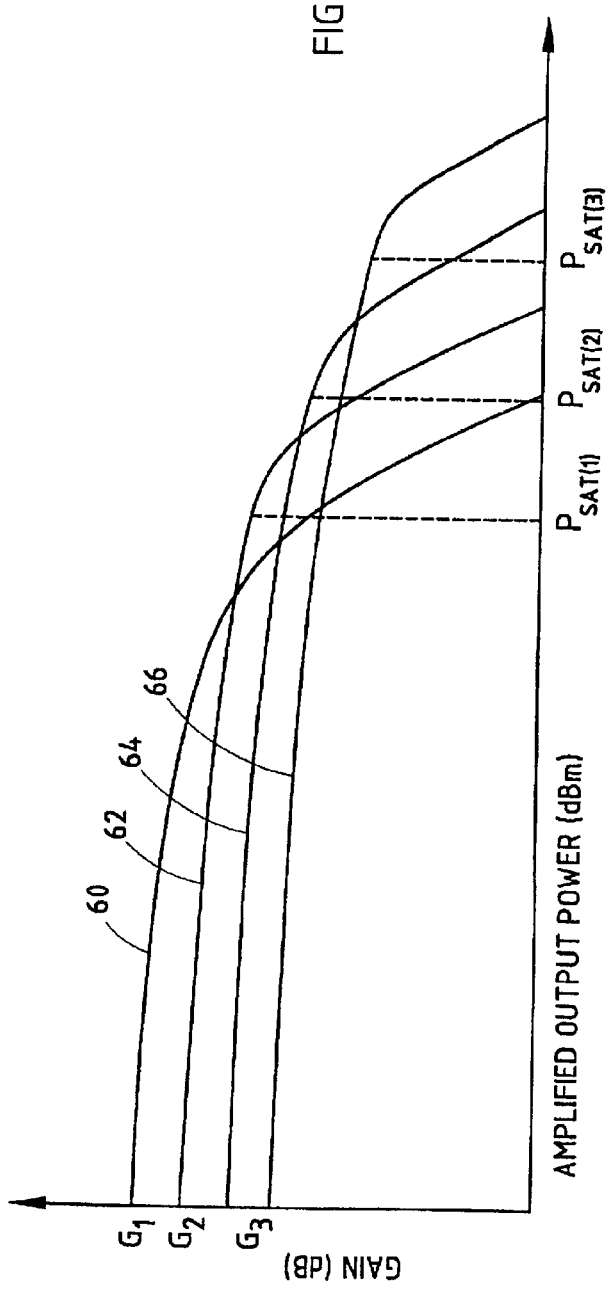
FIG. 5 is a diagram of gain versus amplified output power showing alternative saturation output power points of the semiconductor optical amplifier of FIG. 4 showing the signal gains corresponding thereto.

The principle of operation of the variable optical amplifier 34 is based on the fact that the level of gain compression is proportional to the power of the holding light injected into the semiconductor optical amplifier 18a. A holding light is not required when the level of the amplified signal is low, because the gain versus output power curve of the semiconductor optical amplifier 18a is reasonably flat, as illustrated in FIG. 5. In such a case, variable optical amplifier 34 can be set to a low attenuation and the gain as provided by semiconductor optical amplifier 18a can be maximized. As the signal power of the amplified signal reaching the semiconductor optical amplifier 18a increases, the gain of semiconductor optical amplifier 18a approaches an elbow. It is at this point that the holding light, or the attenuated residual pump radiation, can be increased from the variable optical attenuator 34 to increase the saturation output power of semiconductor optical amplifier 18a. With the current configuration of optical amplifier 10a, the level of the pumping light can be continuously adjusted, via the feed-back loop of the photo diode 38 to variable optical attenuator 34, thereby providing the highest gain possible before cross-gain modulation effects become detrimental to the signals. This trade-off between gain and saturation power is demonstrated schematically in FIG. 5 by a gain curve 60 without the addition of a holding light and gain curves 62, 64 and 66 which illustrated the effect of increasing the holding light supplied to semiconductor optical amplifier 18. In the illustrated example, gains $G_1$ 62, $G_2$ 64, and $G_3$ 66, correspond to saturation output powers $P_{sat(1)}$, $P_{sat(2)}$, and $P_{sat(3)}$, respectively. This particular configuration is advantageous over gain clamped semiconductor optical amplifiers wherein the gain is always limited in the device to around 20 dB, and wherein, unlike the present inventive composite optical amplifier 10a, the grating which provides the lasing action cannot be "turned off" to increase the small signal gain.

Another embodiment of the composite optical amplifier 10b is shown in FIG. 6. Since the composite optical amplifier 10b is similar to the previously described composite optical amplifier 10, similar parts appearing in FIGS. 1 and FIGS. 6, respectively, are represented by the same, corresponding reference numeral, except for the suffix "b." In the composite optical amplifier 10b, a holding light laser source 40 provides a holding light to the variable optical amplifier 34b in a direction 41. The holding light, laser source 40 of composite optical amplifier 10b replaces the residual pump power used as the pumping light in composite optical amplifier 10 described above. The holding light as provided by the holding light laser source 40, is attenuated by a variable optical attenuator 34b as it travels therethrough. The attenuated holding light is then coupled with the amplified signal prior to the amplified signal and the attenuated holding light entering the semiconductor optical amplifier 18b. The variable optical amplifier 34b may be connected in a feed-back loop to a photo diode 38a similar to composite optical amplifier 10a, as described above. If necessary, the residual pump radiation exiting Raman optical amplifier 12b can be divided from the amplified signal by wave division multiplexer 30b.

As shown in FIG. 7, and in accordance with the present invention, the composite optical amplifier 10 (or 10a or 10b) is constructed and configured in accordance with the present invention and used in an optical communication system 42. System 42 includes a transmitter 44 and a receiver 46 wherein transmitter 44 transmits an optical signal via optical fiber 22 to composite optical amplifier 10, which is in turn received by receiver 46 after being amplified by composite optical amplifier 10.

The composite optical amplifiers described herein are effective for amplifying optical signals through any wavelengths within the usable optical signal wavelength range. The composite optical amplifier relaxes the constraints of a high power pump such as that required for solely Raman amplification, while reducing the noise association with a solely semiconductor optical amplification. The composite optical amplifiers described herein further utilize typically wasted residual pump power from the first stage Raman optical amplification to improve the saturation output power of the semiconductor optical amplifier, thereby reducing harmful cross-talk modulation.

It will become apparent to those skilled in the art that various modifications to the preferred embodiment of the invention as described herein can be made without departing from the spirit or scope of the invention as defined by the appended claims.

The invention claimed is:

1. A method for amplifying an optical signal, comprising:
   providing a Raman medium;
   conducting at least one optical signal through the Raman medium;
   amplifying the signal by amplifying a pump radiation to the Raman medium, wherein a portion of the pump radiation amplifies the signal resulting in an amplified signal and a residual pump radiation;
   providing a semiconductor optical amplifier in optical communication with the Raman medium;
   adjusting a saturation output power of the semiconductor optical amplifier by amplifying the residual pump radiation through the semiconductor optical amplifier, thereby reducing signal cross-talk generated within the semiconductor optical amplifier; and
   additionally amplifying the signal by the semiconductor optical amplifier resulting in a twice amplified signal.

2. The method described in claim 1, where the Raman medium providing step 1 includes providing an optical waveguide fiber.

3. The method described in claim 2, wherein the step of amplifying the signal produces a first noise figure from the Raman medium of from about 3 dB to about 5 dB.

4. The method described in claim 3, wherein the step of amplifying the signal produces a first noise figure from the Raman medium of equal to or less than about 4 dB.

5. The method described in claim 3, wherein the step of amplifying the signal results in the amplified signal having gain within the range of from about 15 dB to about 20 dB.

6. The method described in claim 3, wherein the step of amplifying the signal results in the amplified signal having gain equal to or less than about 15 dB.

7. The method described in claim 5, wherein the step of additionally amplifying the amplified signal produces a second noise figure from the semiconductor optical amplifier within the range of from about 7 dB to about 10 dB.

8. The method described in claim 7, wherein the step of additionally amplifying the amplified signal produces a second noise figure from the semiconductor optical amplifier of less than or equal to about 8 dB.

9. The method described in claim 7, wherein the steps of amplifying the signal and of additionally amplifying the signal produces a total noise figure of less than or equal to about 4.3 dB.

10. The method described in claim 1, wherein the step conducting at least one optical signal through the Raman medium includes conducting a plurality of optical signals of different wavelengths through the Raman medium, the step of amplifying the optical signal includes amplifying the plurality of optical signals, and wherein the step of additionally amplifying the signal includes amplifying the plurality of amplified signals.

11. The method described in claim 1, wherein the optical fiber of the step of providing the Raman medium includes providing the optical fiber with a length within the range of about 1 km to about 10 km.

12. The method described in claim 1, and further including:
   providing a first wave division multiplexer that divides the residual pump radiation from the amplified signal;
   providing a second wave division multiplexer that combines the residual pump radiation with the amplified signal, the second wave division multiplexer in optical communication with the first wave division multiplexer; and
   providing an optical isolator positioned so as to remove a backward propagating amplified spontaneous emission from the semiconductor optical amplifier.

13. The method described in claim 1, further including:
   providing a first wave division multiplexer that divides the residual pump radiation from the amplified signal;
   providing a photodiode in optical communication with the Raman medium for measuring the amplified signal power and generating a control signal proportional thereto;

providing a variable optical attenuator in optical communication with the first wave division multiplexer and the photodiode, wherein the attenuation within the variable optical attenuator is adjusted with respect to the control signal received from the photodiode and the variable optical attenuator provides an attenuated residual pump radiation; and providing a second wave division multiplexer that combines the attenuated residual pump radiation with the amplified signal prior to the amplified signal and the attenuated residual pump radiation being received by the semiconductor optical amplifier.

14. An optical signal amplifier, comprising:

a Raman fiber amplifier having an input for receiving an optical signal and a pump radiation, and an output, wherein a portion of the pump radiation amplifies the optical signal resulting in an amplified optical signal and a residual pump radiation; and a semiconductor optical amplifier having an input coupled to the output of the Raman amplifier for receiving the amplified optical signal and the residual pump radiation, wherein the semiconductor optical further amplifies the signal resulting in a twice amplified signal, and wherein the residual pump radiation increases a saturation output power of the semiconductor optical amplifier thereby reducing signal cross-talk in the twice amplified signal.

15. The amplifier of claim 14, wherein the Raman fiber amplifier has an associated first noise figure within the range of from about 3 dB to about 5 dB.

16. The amplifier of claim 15, wherein the Raman fiber amplifier has an associated first noise figure of equal to or less than about 4 dB.

17. The amplifier of claim 15, wherein the semiconductor optical amplifier has an associated second noise figure within the range of from about 7 dB to about 10 dB.

18. The amplifier of claim 17, wherein the semiconductor optical amplifier has an associated second noise figure of equal to or less than about 8 dB.

19. The amplifier of claim 17, wherein the amplified signal has an amplitude within the range of from about 15 dB to about 20 dB.

20. The amplifier of claim 19, wherein semiconductor optical amplifier amplifies the amplified signal to an amplification of within the range of from about 30 dB to about 35 dB.

21. The amplifier of claim 20, wherein the Raman fiber amplifier has a length within the range of from about 1 km to about 10 km.

22. The amplifier of claim 14, and further including:

an optical isolator in optical communication between the Raman fiber amplifier and the semiconductor optical amplifier, the isolator preventing a backward propagating amplified spontaneous emission generated within the semiconductor optical amplifier from reaching the Raman fiber amplifier.

23. The amplifier of claim 14, and further including:

a decoupler that divides the residual pump radiation from the amplified signal;

a photodiode in optical communication with the Raman fiber amplifier for measuring the amplified signal power and generating a control signal proportional thereto;

a variable optical attenuator in optical communication with the decoupler and the photodiode, wherein the attenuation within the variable optical attenuator is adjusted with respect to the control signal received from the photodiode and the variable optical attenuator emits an attenuated residual pump radiation, thereby adjusting the saturation output power of the semiconductor optical amplifier; and a coupler that combines the attenuated residual pump radiation with the amplified signal.

24. An optical communications system, comprising:

an optical signal transmitter;

a first waveguide optical fiber for guiding an optical signal generated by the transmitter;

a first coupler for coupling a pump radiation with the waveguide optical fiber;

a Raman fiber amplifier optically coupled to the optical waveguide fiber; wherein a portion of the pump radiation amplifies the optical signal resulting in an amplified optical signal and a residual pump radiation;

a semiconductor optical amplifier in optical communication with the Raman fiber amplifier, wherein the semiconductor optical amplifier amplifies the amplified signal resulting in a twice amplified signal and the residual pump radiation increases a saturation output power of the semiconductor optical amplifier, thereby reducing signal cross-talk in the twice amplified signal;

a second waveguide optical fiber for guiding the twice amplified signal; and an optical signal receiver for receiving the twice amplified signal.

25. The communications system of claim 24, wherein the Raman fiber amplifier has an associated first noise figure within the range of from about 3 dB to about 5 dB.

26. The communications system of claim 25, wherein the semiconductor optical amplifier has an associated second noise figure within the range of from about 7 dB to about 10 dB.

27. The communications system of claim 26, wherein the amplified signal includes a gain within the range of from about 15 dB to about 20 dB.

28. The communications system of claim 27, wherein the twice amplified signal includes a gain within the range of from about 30 dB to about 35 dB.

29. The communications system of claim 24, wherein the Raman fiber amplifier has a length within the range of about 1 km to about 10 km.

30. The communications system of claim 24, and further including:

an optical isolator in optical communication with the Raman fiber amplifier and the semiconductor optical amplifier, the isolator preventing a backward propagating amplified spontaneous emission generated within the semiconductor optical amplifier from reaching the Raman fiber amplifier.

31. The amplifier of claim 24, and further including:

a decoupler that divides the residual pump radiation from the amplified signal;

a photodiode in optical communication with the Raman fiber amplifier for measuring the amplified signal power and generating a control signal proportional thereto;

a variable optical attenuator in optical communication with the decoupler and the photodiode, wherein the attenuation within the variable optical attenuator is adjusted with respect to the control signal received from the photodiode and the variable optical attenuator emits an attenuated residual pump radiation; and a second coupler that combines the attenuated residual pump radiation with the amplified signal.

32. An optical signal amplifier, comprising:

a first waveguide optical fiber for guiding an optical signal;

a first coupler for coupling a pump radiation with the waveguide optical fiber;

a Raman fiber amplifier optically coupled to the optical waveguide fiber, wherein a portion of the pump radiation amplifies the optical signal resulting in an amplified optical signal and a residual pump radiation;

a decoupler for decoupling the residual pump radiation from the amplified signal;

a holding light laser source for generating a holding light; and a semiconductor optical amplifier for receiving the amplified signal and the holding light, wherein the semiconductor optical amplifier amplifies the amplified signal resulting in a twice amplified signal and the holding light increases a saturation output power of the semiconductor optical amplifier, thereby reducing signal cross-talk in the twice amplified signal.

33. The optical amplifier of claim 32, further including:

a photodiode in optical communication with the Raman fiber amplifier for measuring the amplified signal power and generating a control signal proportional thereto;

a variable optical attenuator in optical communication with the holding light laser source and the photodiode, wherein the attenuation within the variable optical attenuator is adjusted with respect to the control signal received from the photodiode and the variable optical attenuator emits an attenuated holding light, thereby adjusting the saturation output power of the semiconductor optical amplifier; and a second coupler that combines the attenuated holding light with the amplified signal.

34. The amplifier of claim 33, further including:

an optical isolator in optical communication with the Raman fiber amplifier and the semiconductor optical amplifier, the isolator preventing a backward propagating amplified spontaneous emission generated within the semiconductor optical amplifier from reaching the Raman fiber amplifier.

* * * * *